(12) United States Patent
Yang et al.

(10) Patent No.: US 12,174,616 B2
(45) Date of Patent: Dec. 24, 2024

(54) CONTROL SYSTEM FOR ADAPTIVE CONTROL OF A THERMAL PROCESSING SYSTEM

(71) Applicants: Beijing E-Town Semiconductor Technology Co., Ltd., Beijing (CN); Mattson Technology, Inc., Fremont, CA (US)

(72) Inventors: Michael X. Yang, Palo Alto, CA (US); Markus Lieberer, Augsburg (DE); Joseph Cibere, Burnaby (CA)

(73) Assignees: Beijing E-Town Semiconductor Technology Co. Ltd., Beijing (CN); Mattson Technology, Inc., Fremont, CA (US)

( * ) Notice: Subject to any disclaimer, the term of this patent is extended or adjusted under 35 U.S.C. 154(b) by 0 days.

(21) Appl. No.: 18/313,655

(22) Filed: May 8, 2023

(65) Prior Publication Data

US 2023/0273596 A1 Aug. 31, 2023

Related U.S. Application Data

(62) Division of application No. 17/084,228, filed on Oct. 29, 2020, now Pat. No. 11,644,817.

(Continued)

(51) Int. Cl.
*G05B 19/4155* (2006.01)
*H01L 21/67* (2006.01)

(52) U.S. Cl.
CPC .... *G05B 19/4155* (2013.01); *H01L 21/67109* (2013.01); *H01L 21/67248* (2013.01); *G05B 2219/50333* (2013.01)

(58) Field of Classification Search
None
See application file for complete search history.

(56) References Cited

U.S. PATENT DOCUMENTS 6,596,973 B1 7/2003 Donald
8,762,307 B2 6/2014 Hashimoto et al.
(Continued)

FOREIGN PATENT DOCUMENTS

JP 2006-138637 6/2006
KR 10-1453959 11/2014
WO WO 00-09976 2/2000

OTHER PUBLICATIONS

Hagan, et. al., An introduction to the use of neural networks in control systems, vol. 12, Issue II, Special Issue: Applications of Neural Networks in Control and Instrumentation, Sep. 2002, pp. 959-985.

(Continued)

*Primary Examiner* — Ryan A Jarrett
(74) *Attorney, Agent, or Firm* — Dority & Manning, P.A.

(57) ABSTRACT

A control system operable to train a control tuner to generate temperature setpoint tracking improvements for a thermal processing system is provided. In one example implementation, temperature setpoint tracking improvements are achieved by generating system controller parameter adjustments based on a difference between a simulated workpiece temperature estimate and an actual workpiece temperature estimate. For example, a system model can generate a simulated workpiece temperature estimate simulating an actual workpiece temperature estimate, and based on the difference between the simulated and actual workpiece temperature estimates, generate clone controller parameter adjustments. The clone controller parameter adjustments can be used to generate system controller parameter adjustments, which can improve temperature setpoint tracking for the thermal processing system.

6 Claims, 8 Drawing Sheets

Related U.S. Application Data

(60) Provisional application No. 62/929,404, filed on Nov. 1, 2019.

(56) References Cited

U.S. PATENT DOCUMENTS

| | | | |
|---|---|---|---|
| 9,329,582 | B2 | 5/2016 | Boe et al. |
| 9,958,839 | B2 | 5/2018 | Li et al. |
| 2005/0221514 | A1 | 10/2005 | Pasadyn et al. |
| 2006/0100735 | A1* | 5/2006 | Hauf .................... H01L 21/324 700/121 |
| 2008/0182343 | A1 | 7/2008 | Deshpande et al. |

OTHER PUBLICATIONS

Rivas-Echeverria, et. al., Neural Network-based Auto-Tuning for PID Controllers, Proceedings of the 5th WSES International Conference on Circuits, Systems, Communications and Computers, (CSCC 2001).

Reichensdorfer, et. al., Recurrent Neural Networks for PID Auto-tuning, Institute for Data Processing Technische Universitat Munchen, Sep. 9, 2017.

Sui, et. al., Application of Neural Network in Optimization of PID Controller, Metallurgical and Mining Industry, No. 7, 2015.

Zilkova, et. al., Nonlinear System Control Using Neural Networks, Acta Polytechnica Hungarica, vol. 3, No. 4, 2006.

PCT International Search Report and Written Opinion for corresponding PCT Application No. PCT/US2020/057872, mailed on Feb. 18, 2021, 9 pages.

\* cited by examiner

CONTROL SYSTEM FOR ADAPTIVE CONTROL OF A THERMAL PROCESSING SYSTEM

PRIORITY CLAIM

The present application claims the benefit of priority to U.S. patent application Ser. No. 17/084,228, titled "Control System for Adaptive Control of A Thermal Processing System" having a filing date of Oct. 29, 2020, which is based on and claims priority to U.S. Provisional Application Ser. No. 62/929,404, filed on Nov. 1, 2019, titled "Control System for Adaptive Control of a Thermal Processing System," which is incorporated herein by reference.

FIELD

The present disclosure relates generally to thermal processing systems.

BACKGROUND

A thermal processing chamber as used herein refers to a device that heats workpieces, such as semiconductor wafers. Such devices can include a support plate for supporting one or more semiconductor wafers and an energy source for heating the semiconductor wafers, such as heating lamps, lasers, or other heat sources. During heat treatment, the semiconductor wafers can be heated under controlled conditions according to a preset temperature regime.

Many semiconductor heating processes require a wafer to be heated to high temperatures so that various chemical and physical transformations can take place as the wafer is fabricated into a device(s). During rapid thermal processing, for instance, semiconductor wafers can be heated by an array of lamps through the support plate to temperatures from about 300° C. to about 1,200° C., for times that are typically less than a few minutes. The range and duration of these temperatures is generally determined by a temperature setpoint profile. During these processes, a primary goal can be to adaptively control the thermal processing system to improve temperature setpoint profile tracking performance.

SUMMARY

Aspects and advantages of embodiments of the present disclosure will be set forth in part in the following description, or may be learned from the description, or may be learned through practice of the embodiments.

One example aspect of the present disclosure is directed to a thermal processing system. The system includes a processing chamber. The system includes a workpiece support operable to support a workpiece during thermal processing in the processing chamber. The system includes one or more heat sources operable to heat the workpiece in the processing chamber during thermal processing of the workpiece. The system includes one or more sensors configured to obtain data associated with a workpiece temperature. The system includes a control system configured to perform operations. The operations include, for instance, determining an actual workpiece temperature estimate based at least in part on the data associated with a workpiece temperature of a first workpiece during thermal processing of the workpiece; obtaining a simulated temperature estimate for the first workpiece using a system model, the system model providing the simulated temperature estimate based on one or more model parameters and one or more controller outputs; adjusting one or more controller parameters of a system controller based at least in part on a difference between the simulated temperature estimate obtained using the system model and a temperature setpoint; and controlling, by the system controller, one or more operating parameters of the thermal processing system based at least in part on the controller parameters to regulate a workpiece temperature of a second workpiece during thermal processing.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
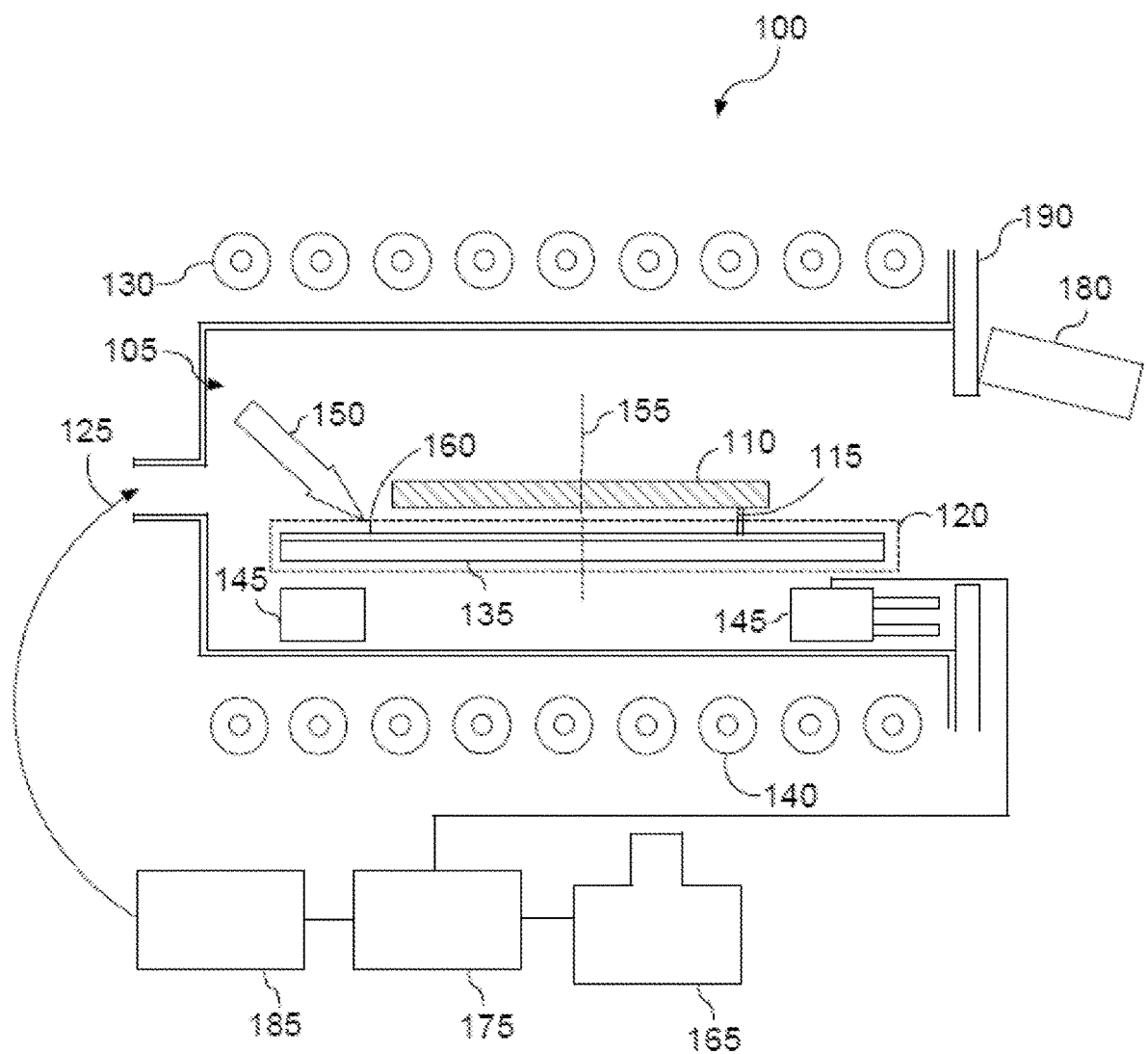
FIG. 1 depicts an example rapid thermal processing (RTP) system having a support plate with spatially arranged low transmission zones according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to control systems for adaptively controlling the heat applied to workpieces in a thermal processing system. Workpieces can include, for instance, semiconductor workpieces, opto-electronic workpieces, flat panel displays, or other suitable workpieces. The workpiece materials can include, for instance, silicon, silicon germanium, glass, plastic, or other suitable material. In some embodiments, the workpieces can be semiconductor wafers. The heat can be applied to these workpieces based on a temperature setpoint profile.

A temperature setpoint profile can be configured to specify a plurality of different temperatures be applied to a workpiece over time to thermally treat the workpiece. For instance, the temperature setpoint profile can specify that a workpiece be heated at a first temperature for 10 seconds and ramped to and heated at a second temperature for less than 1 second. Both the range and number of temperatures of a temperature setpoint profile can be specified to occur at certain times. In some embodiments, the temperature setpoint profile can be specified or selected by a user or technician as part of a process recipe.

During processing, a control system for a thermal processing system can be operable to determine actual workpiece temperature estimate associated with a workpiece. An actual workpiece temperature estimate can be determined based on data from one or more sensors in the thermal processing system, including but not limited to radiometers, optical detectors, pyrometers, visible wavelength imaging systems, infrared imaging systems, or any other sensor(s) operable to estimate the temperature of a workpiece.

The control system can compare the actual workpiece temperature estimate with a temperature specified by the temperature setpoint profile to determine an error or difference between the actual workpiece temperature estimate and the temperature setpoint profile. The control system can adjust operating parameters of the thermal processing system (e.g., amount of heat emitted by the heat source, for instance, by controlling lamp power). According to example aspects of the present disclosure, the control system can implement control routines improve the performance of the thermal processing system by accurately tracking the temperature specified by a temperature setpoint profile relative to the actual temperature estimate of the workpiece during thermal processing to reduce error.

In some embodiments, the control system can access a system model. A system model can be trained to emulate the conditions and output of a thermal processing system. More specifically, a system model can be trained to provide a simulated temperature estimate associated with a workpiece, the simulated temperature estimate simulating an actual temperature estimate associated with the workpiece or an actual temperature output associated with the workpiece based on specified operating conditions of the thermal processing system. Furthermore, a system model can be trained to provide simulated workpiece properties associated with a workpiece, the simulated properties simulating actual temperature, optical, radiometric, emission, and other properties associated with a workpiece.

According to example aspects of the present disclosure, the system model can be a machine learned model. For example, the system model can be a random forest classifier; a logistic regression classifier; a support vector machine; one or more decision trees; a neural network; and/or other types of models including both linear models and non-linear models. Neural networks can include deep neural networks, feed-forward neural networks, recurrent neural networks (e.g., long short-term memory recurrent neural networks), convolutional neural networks, or combinations thereof. For example, the system model may be trained to provide a simulated temperature estimate by using a machine-learned neural network that is trained by a learning routine using data collected from the processing of test workpieces and/or actual workpieces.

In some embodiments, the system model can be trained using a system learning routine. An error value can be determined based at least in part on a difference between a simulated temperature estimate and an actual temperature workpiece estimate. A system learning routine can be a differentiable objective function operable to, when optimized, provide modifications for the system model that reduce the error value associated with a difference between a simulated workpiece temperature and an actual temperature output obtained from a test workpiece and/or the difference between simulated workpiece properties associated with a workpiece and actual temperature and optical properties associated with the workpiece. The system learning routine can receive one or more inputs, including but not limited to a difference between an actual system output and a simulated temperature estimate, and a difference between simulated workpiece properties and actual workpiece properties.

In some embodiments, a test workpiece can be used to obtain data associated with a workpiece temperature for training of the system model for a thermal processing system. Data associated with a workpiece temperature that is obtained using a test workpiece can be sufficiently accurate as to be considered an actual temperature output. A test workpiece can include one or more sensors operable to measure the heat being applied to the workpiece. For example, a test workpiece may include one or more thermocouples to measure the heat of the workpiece. The thermocouples can measure the heat at a precision sufficient to provide an actual temperature output. Furthermore, optical properties associated with the test workpiece can be known. Temperature and optical properties associated with the test workpiece can be measured and/or calculated in advance to assist in testing and/or calibrating thermal processing system performance.

In some embodiments, the system learning routine may receive a first temperature difference between an actual temperature output associated with a test workpiece and a simulated temperature estimate associated with the test workpiece. The system learning routine may also receive a first optical difference between an actual optical property associated with the test workpiece and an estimated optical property associated with the test workpiece. Based at least in part on the first temperature difference and/or the first optical difference, the system learning routine can generate one or more parameter modifications to modify one or more parameters associated with the system model.

For example, the system learning routine may produce a first simulated temperature estimate associated with a test workpiece that is significantly different than a first actual temperature output associated with the test workpiece. The system learning routine can generate one or more parameter modifications to modify one or more parameters associated with the system model. The control system can apply the one or more parameter modifications to the system model. The system model may then produce a second simulated temperature output associated with the test workpiece that is more accurate than the first simulated temperature output.

In some embodiments, the system model can include a plurality of submodels. A system model submodel can more effectively simulate one subsystem of the system. For example, the system model may include a workpiece deformation submodel to more accurately simulate the effect of workpiece deformation in the system. For another example, the system model may include a workpiece/chamber optical submodel to more accurately simulate workpiece optical properties. For yet another example, the system model may include a workpiece/chamber thermal submodel to more accurately simulate estimated workpiece temperatures.

In some embodiments, the control system can modify the parameters of the system model using an optimization method. An optimization method can be, but is not limited to, one or more of backpropagation, stochastic gradient descent, mini-batch gradient descent, or any other first or second order optimization method that can be applied to a machine learned model. For example, one or more modifications can be applied to the system model by utilizing a stochastic gradient descent method. For another example, the one or more modifications can be determined and applied using a backpropagation method in conjunction with a mini-batch gradient descent method. For yet another example, the one or more modifications can be determined and applied using a backpropagation method in conjunction with a different first order optimization method.

In some embodiments, the control system can include a system controller. The system controller can be configured to control one or more operating parameters of the thermal processing system. The operating parameters of the thermal processing system can include, but are not limited to, heat output, duration and/or intensity of heat, or any other adjustments to any components of the thermal processing system. For example, the system controller can control one or more operating parameters of the thermal processing system to adjust the output of heat from one or more components (e.g., lamps) of the thermal processing system.

In some embodiments, the control system can include a trusted control tuner. The trusted control tuner can adjust one or more system controller parameters of the system controller. Adjusting the one or more system controller parameters of the system controller can, at least in part, affect how the system controller controls the one or more operating parameters of the thermal processing system using system controller outputs. The one or more system controller parameters can be, for instance, gains used in a proportional integral controller, proportional derivative controller, and/or proportional integral derivative controller.

For example, the trusted control tuner may adjust one or more system controller parameters of the system controller. Based at least in part on the one or more system controller parameter adjustments, the system controller can adjust one or more operating parameters of the thermal processing system to adjust the output of heat from one or more components of the thermal processing system using system controller outputs.

In some embodiments, the control system may include a clone system controller operable to provide outputs indicative of controller parameters to the system model. The system model, based at least in part on the clone system controller outputs from the clone system controller, can provide a simulated workpiece temperature estimate. Initially, the clone system controller outputs can be clone controller outputs that mirror or clone the actual controller output of the control system of the thermal processing system. The clone system controller can include one or more clone controller parameters. The one or more clone controller parameters of the clone system controller can be, for instance, gains used in a proportional integral controller, proportional derivative controller, and/or proportional integral derivative controller.

In some embodiments, the one or more clone controller parameters can be adjusted by a clone control tuner. The clone control tuner can be operable to modify the one or more clone controller parameters of a clone system controller based on control tuner adjustments learned using a tuning learning routine. More specifically, a clone control tuner can be operable to provide one or more clone controller parameter adjustments to the clone system controller based at least in part on a difference between the simulated workpiece temperature estimate and a temperature setpoint.

In some embodiments, the clone control tuner can be a model (e.g., a machine learned model) that correlates errors to adjustments in controller parameters. For example, the clone control tuner can be a random forest classifier; a logistic regression classifier; a support vector machine; one or more decision trees; a neural network; and/or other types of models including both linear models and non-linear models. Neural networks can include deep neural networks, feed-forward neural networks, recurrent neural networks (e.g., long short-term memory recurrent neural networks), convolutional neural networks, or combinations thereof. For example, the clone control tuner may be trained to provide one or more clone controller parameter adjustments by using an artificial neural network.

In some embodiments, the clone control tuner can be trained by a tuning learning routine. A tuning learning routine can determine control tuner adjustments based on simulated temperature estimates of workpieces during thermal processing. In some embodiments, the tuning learning routine can implement a differentiable objective function operable to, when optimized, provide modifications for parameters of the clone control tuner that can reduce a difference between a simulated workpiece temperature estimate and the temperature setpoint. The tuning learning routine can receive one or more inputs, including but not limited to a difference between the simulated workpiece temperature estimate and the temperature setpoint.

For example, the tuning learning routine may receive a first temperature difference between a simulated workpiece temperature estimate associated with a workpiece and a temperature setpoint associated with the workpiece. Based at least in part on the first temperature difference, the tuning learning routine can generate and apply one or more control tuner adjustments to adjust one or more parameters of the clone control tuner. In conjunction, the clone control tuner can apply clone controller parameter adjustments to the clone system controller based at least in part on the control tuner adjustments of the tuning learning algorithm. These clone controller parameter adjustments can be operable to modify outputs provided by the clone system controller to the system model simulating performance of the thermal processing system, which can lead to a reduction in the difference between the workpiece temperature estimate and the temperature setpoint.

In some embodiments, the tuning learning routing can determine the control tuner adjustment using an optimization method. An optimization method can be, but is not limited to, one or more of backpropagation, stochastic gradient descent, mini-batch gradient descent, or any other first or second order optimization method. For example, one or more adjustments can be applied to the clone control tuner by utilizing a stochastic gradient descent method. For another example, the one or more adjustments can be determined and applied using a backpropagation method in conjunction with a mini-batch gradient descent method. For yet another example, the one or more adjustments can be determined and applied using a backpropagation method in conjunction with a different first order optimization method.

In some embodiments, the clone controller parameter adjustments generated by the clone control tuner can be recorded in a recipe type recorder. Each of the one or more clone controller parameter adjustments can be linked to one or more workpiece types or process recipes in the recipe type recorder. The recipe type recorder can be a database, data structure, record, etc. The recipe type recorder can track the performance of the simulated workpiece temperature estimate resulting from the clone controller parameter adjustments.

If the clone system controller controls the system model to produce a simulated workpiece temperature estimate that is more accurate than a previously-stored simulated workpiece temperature estimate stored in the recipe type recorder, a trigger condition can be satisfied. If the trigger condition is satisfied, the clone control tuner can provide the same clone controller parameter adjustments to the trusted control tuner. The trusted control tuner can generate one or more system controller parameter adjustments for the system controller based at least in part on the one or more clone controller parameter adjustments.

For example, the clone control tuner can produce one or more clone controller parameter adjustments that are determined to decrease the difference between the simulated workpiece temperature estimate and the temperature setpoint. The clone control tuner can provide these one or more clone controller parameter adjustments to the trusted control tuner. The trusted control tuner can generate one or more system controller parameter adjustments for the system controller based at least in part on the clone controller parameter adjustments. The system controller's controller parameters can be adjusted, resulting in a more accurate tracking of actual workpiece temperature with a temperature setpoint profile.

In some embodiments, the system will evaluate whether the one or more system controller parameter adjustments increases performance. If the actual workpiece temperature estimate is determined to increase performance, the trusted control tuner can retain the one or more system controller parameter adjustments. If the actual workpiece temperature estimate is determined to decrease performance, the control system can determine that an adjustment error has occurred. If an adjustment error has occurred, the trusted control tuner can discard the one or more system controller parameter adjustments and alert a system model watchdog. The system model watchdog can determine, based on the decreased performance, that the system model should be retrained. Alternatively, the system model watchdog may apply a system model modification to the system model, the system model modification operable to correct the adjustment error.

For example, the trusted control tuner may apply the one or more system controller parameter adjustments to the system controller. The actual workpiece temperature estimate may suffer from reduced performance in tracking the temperature setpoint. In response, the trusted control tuner can discard the one or more system controller parameter adjustments. Furthermore, the system model watchdog can determine the system model should be retrained and initiate retraining of the system model.

Aspects of the present disclosure can achieve a number of technical effects and benefits. For instance, aspects of the present disclosure can continuously reduce errors in temperature setpoint tracking of the system, leading to more efficient and productive thermal processing. In addition, aspects of the present disclosure can be used to generate more robust system models for a thermal processing system, leading to more accurate workpiece temperature estimates, etc.

Variations and modifications can be made to these example embodiments of the present disclosure. As used in the specification, the singular forms "a," "and," and "the" include plural referents unless the context clearly dictates otherwise. The use of "first," "second," "third," and "fourth" are used as identifiers and are directed to an order of processing. Example aspects may be discussed with reference to a "substrate," "wafer," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value.

With reference now to the FIGS., example embodiments of the present disclosure will now be discussed in detail. FIG. 1 depicts an example rapid thermal processing (RTP) system 100 having a support plate 120 with spatially arranged low transmission zones according to example embodiments of the present disclosure. As illustrated, the RTP system 100 includes a RTP chamber 105, a workpiece 110, a support plate 120, heat sources 130 and 140 (e.g., lamps), air bearings 145, a pyrometer 165, a controller 175, a door 180, and a gas flow controller 185.

The workpiece 110 to be processed is supported in the RTP chamber 105 (e.g., a quartz RTP chamber) by the support plate 120. The support plate 120 is a workpiece support operable to support a workpiece 110 during thermal processing. The support plate 120 incudes a rotatable base 135 and at least one support structure 115 extending from the rotatable base 135. A support structure describes a structure contacting and supporting a workpiece during thermal processing. Examples of the support structure can include one or more support pins, a ring support, or any other suitable support that contacts and supports a workpiece. As shown in FIG. 1, the support structure 115 includes one or more support pins (only one shown). The support structure 115 and the rotatable base 135 can transmit heat from the heat sources 140 and to absorb heat from the workpiece 110. In some embodiments, the support structure 115 and the rotatable base 135 can be made of quartz. The rotatable base 135 rotates the workpiece 110 at a defined rotation orientation and at a defined rotation speed, as further described below.

A guard ring (not shown) can be used to lessen edge effects of radiation from one or more edges of the workpiece 110. An end plate 190 seals to the chamber 105, and the door 180 allows entry of the workpiece 110 and, when closed, allows the chamber 105 to be sealed and a process gas 125 to be introduced into the chamber 105. Two banks of heat sources operable to heat the workpiece in the processing chamber (e.g., lamps, or other suitable heat sources) 130 and 140 are shown on either side of the workpiece 110.

A gas flow 150 can be an inert gas that does not react with the workpiece 110, or the gas flow 150 can be a reactive gas such as oxygen or nitrogen that reacts with the material of the workpiece 110 (e.g. a semiconductor wafer, etc.) to form a layer of on the workpiece 110. In some embodiments, an electrical current can be run through the atmosphere in the RTP system 100 to produce ions that are reactive with or at the surface, and to impart extra energy to the surface by bombarding the surface with energetic ions.

The controller 175 controls the rotatable base 135 to rotate the workpiece 110. For example, the controller 175 generates an instruction that defines the rotation orientation and the rotation speed of the rotatable base 135 and controls the rotatable base 135 to rotate the workpiece 110 with the defined rotation orientation and the defined rotation speed. The rotatable base 135 is supported by the air bearings 145. The gas flow 150 impinging on the rotatable base 135 causes the rotatable base 135 to rotate about an axis 155.

The controller 175 is used to control the heat sources 130 and 140. The controller 175 can be used to control the gas flow controller 185, the door 180, and/or the temperature measuring system, denoted here as the pyrometer 165. The controller 175 can be modified dynamically to increase temperature setpoint tracking performance, which will be discussed in-depth in the following figures.

As used herein a controller, control system, or one or more components of a control system can include one or more processors and one or more memory devices. The one or more processors can be configured to execute computer-readable instructions stored in the one or more memory devices to perform operations, such as any of the operations for controlling a thermal processing system described herein.

FIG. 1 depicts an example thermal processing system 100 for purposes of illustration and discussion. Those of ordinary skill in the art, using the disclosures provided herein, will understand that aspects of the present disclosure can be used with other thermal processing systems for workpieces without deviating from the scope of the present disclosure.

Figure 2:
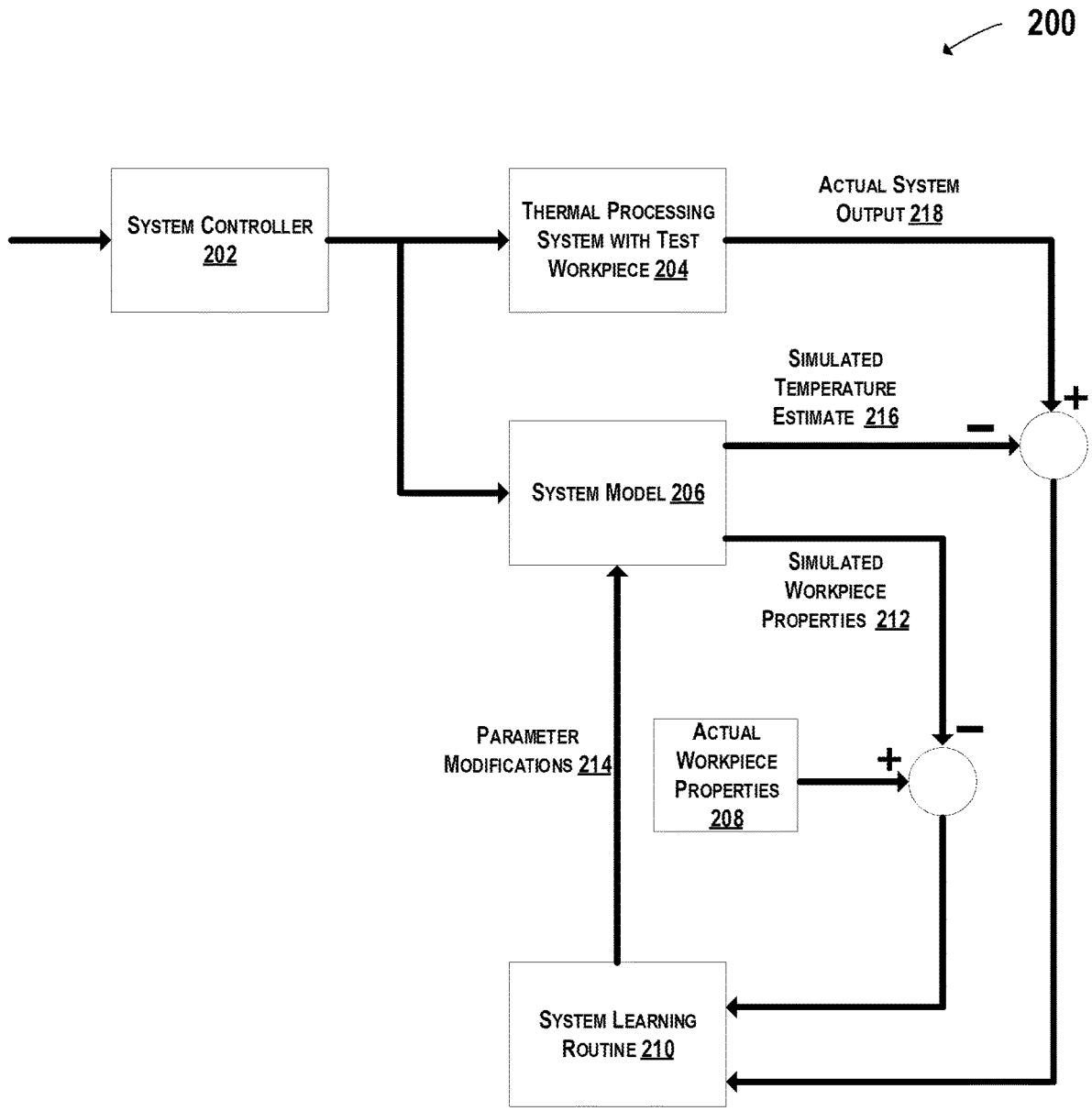
FIG. 2 depicts an example schematic representation of a control routine operable to train a system model using a learning routine to determine workpiece temperature and other properties based on parameters of the thermal processing system according to example embodiments of the present disclosure.

FIG. 2 depicts an example schematic representation of a control routine 200 operable to train a system model using a learning routine to determine workpiece temperature and other properties based on parameters of the thermal processing system.

A system controller 200 (e.g., controller 175 in FIG. 1) can be operable to provide controller outputs to control components of a thermal processing system 204 during processing of a test workpiece. The test workpiece can include one or more sensors operable to measure the temperature of the workpiece. For example, the test workpiece may include one or more thermocouples to measure the temperature of the workpiece. The one or more sensors of the test workpiece can record the temperature with sufficient accuracy to produce an actual system output 218. Furthermore, the test workpiece can include actual workpiece properties 208. Actual workpiece properties 208 can be measured and/or calculated in advance to assist in testing and/or calibrating thermal processing system performance.

The system controller 200 can be further operable to provide controller outputs to the system model 206. The system model 206 can be trained to emulate the conditions and output of the thermal processing system with test workpiece 204. More specifically, the system model 206 can be trained to provide a simulated temperature estimate 216 for the test workpiece 204 that simulates an actual system output 218. Furthermore, the system model 206 can be trained to provide simulated workpiece properties 212 associated with the test workpiece of to simulate actual workpiece properties 208.

In some embodiments, the system model 206 can be a machine learned model. For example, the system model 206 can be a random forest classifier; a logistic regression classifier; a support vector machine; one or more decision trees; a neural network; and/or other types of models including both linear models and non-linear models. Neural networks can include deep neural networks, feed-forward neural networks, recurrent neural networks (e.g., long short-term memory recurrent neural networks), convolutional neural networks, or combinations thereof. For example, the system model 206 may utilize a machine-learned neural network trained by a learning routine to provide a simulated temperature estimate 216.

The system model 206 can be trained using a system learning routine 210. The system learning routine 210 can be a differentiable objective function operable to, when optimized, provide parameter modifications 214 for the system model 206 that reduce the difference between the simulated temperature estimate 216 and the actual system output 218 and/or the difference between simulated workpiece properties 212 and actual workpiece properties 208. The system learning routine 210 can receive one or more inputs, including but not limited to a difference between an actual system output 218 and a simulated temperature estimate 216, and a difference between simulated workpiece properties 212 and actual workpiece properties 208.

The control system 200 can apply the parameter modifications 214 to the system model 206 using an optimization method. An optimization method can be, but is not limited to, one or more of backpropagation, stochastic gradient descent, mini-batch gradient descent, or any other first or second order optimization method that can be applied to a machine learned model. For example, one or more modifications can be applied to the system model by utilizing a stochastic gradient descent method. For another example, the one or more modifications can be determined and applied using a backpropagation method in conjunction with a mini-batch gradient descent method. For yet another example, the one or more modifications can be determined and applied using a backpropagation method in conjunction with a different first order optimization method.

Figure 3:
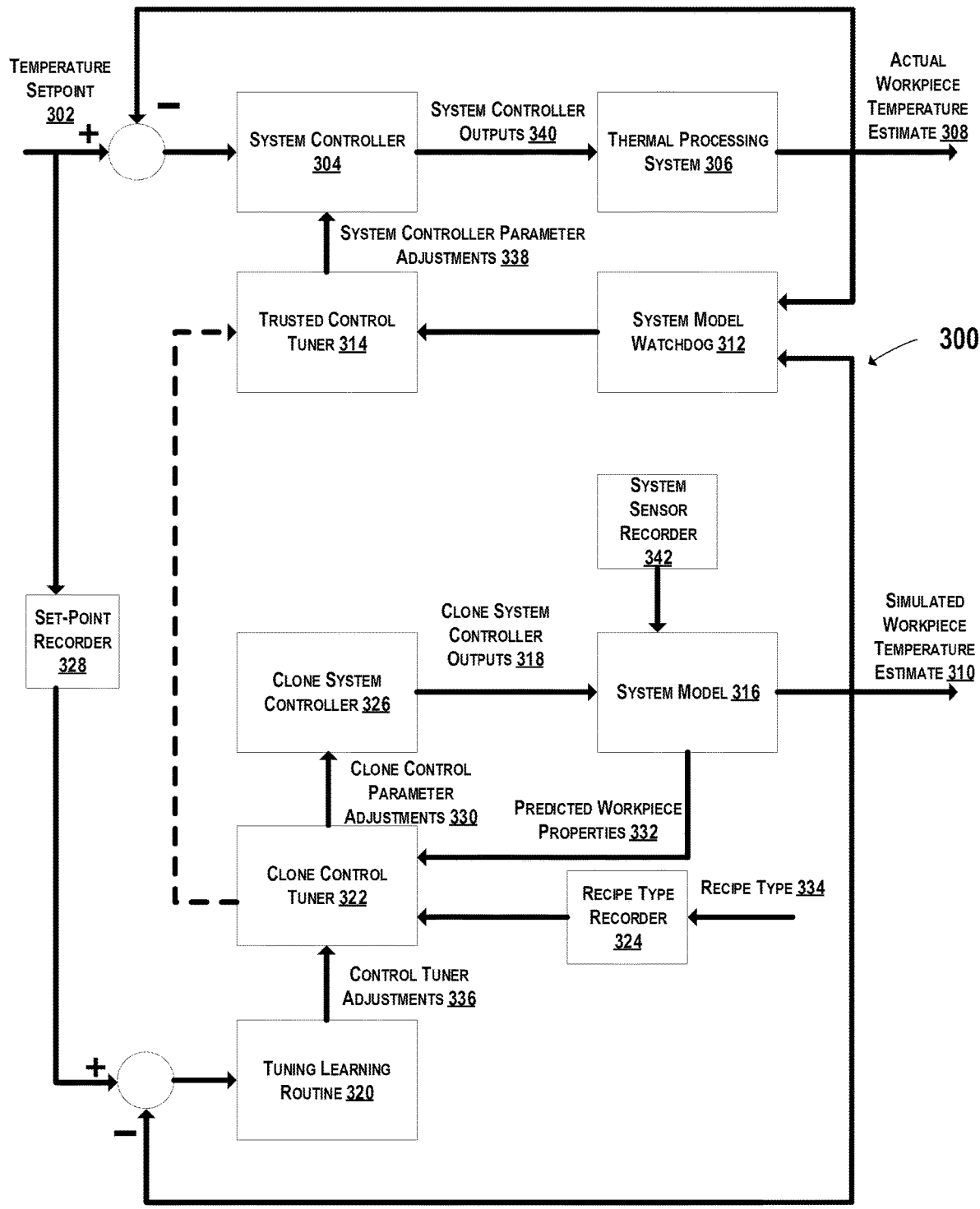
FIG. 3 shows a schematic representation of a control routine operable to train a workpiece deformation submodel of a system model to emulate thermal processing system radiometric outputs according to example embodiments of the present disclosure.

The system model 206 can include one or more submodels. FIG. 3 depicts an example schematic representation of a control routine 300 operable to train a workpiece deformation submodel of a system model to emulate thermal processing system radiometric outputs according to example embodiments of the present disclosure.

Lamp power levels 302 can be determined based at least in part by a temperature set point 602, as depicted in FIG. 3. The lamp power levels 302, along with the known test workpiece temperature and optical properties 318, are sent as inputs to the model parameter tuner 312. The lamp power levels 302 are also sent as an input to the radiometer/chamber model 304.

The radiometer/chamber physical model 304 can emulate the conditions and output of the radiometer of a thermal processing system based at least in part on the lamp power levels 302. The radiometer/chamber model 304 includes a plurality of model parameters. The model parameters can be adjusted by the model parameter tuner 312 using model parameter adjustments 316.

Similarly, the workpiece deformation model 306 can emulate the conditions and output of workpiece deformation during thermal processing. The workpiece deformation model also includes a plurality of model parameters operable to be adjusted by the model parameter tuner 312. The workpiece deformation model 306, in conjunction with radiometer/chamber model 304, can produce estimated radiometer signals 320. The estimated radiometer signals 320 are operable to estimate actual radiometer signals associated with the radiometer of the thermal processing system.

The model parameter tuner 312 can be trained to dynamically adjust the parameters of the radiometer/chamber model 304 and the workpiece deformation model 306 using model parameter adjustments 316. The model parameter tuner 312 can be a machine learned model. For example, the model parameter tuner 312 can be a random forest classifier; a logistic regression classifier; a support vector machine; one or more decision trees; a neural network; and/or other types of models including both linear models and non-linear models. Neural networks can include deep neural networks, feed-forward neural networks, recurrent neural networks (e.g., long short-term memory recurrent neural networks), convolutional neural networks, or combinations thereof. For example, the model parameter tuner 312 may be an artificial neural network trained to dynamically adjust the parameters of the radiometer/chamber model 304 and the workpiece deformation model 306 using model parameter adjustments 316.

The model parameter tuner 312 can be trained using a tuning learning routine 310. The tuning learning routine 310 can be a differentiable objective function operable to, when optimized, provide tuning parameter adjustments 314 for the model parameter tuner that reduce the difference between the estimated radiometer signals 320 and the actual radiometer signals 308. The tuning learning routine 310 can receive one or more inputs, including but not limited to a difference between the estimated radiometer signals 320 and the actual radiometer signals 308.

The control routine 300 can apply the model parameter adjustments 316 to the radiometer/chamber model 304 and the workpiece deformation model 306 using an optimization method. An optimization method can be, but is not limited to, one or more of backpropagation, stochastic gradient descent, mini-batch gradient descent, or any other first or second order optimization method that can be applied to a machine learned model. For example, one or more adjustments can be applied to the radiometer/chamber model 304 and the workpiece deformation model 306 by utilizing a stochastic gradient descent method. For another example, the one or more adjustments can be determined and applied using a backpropagation method in conjunction with a mini-batch gradient descent method. For yet another example, the one or more adjustments can be determined and applied using a backpropagation method in conjunction with a different first order optimization method.

Figure 4:
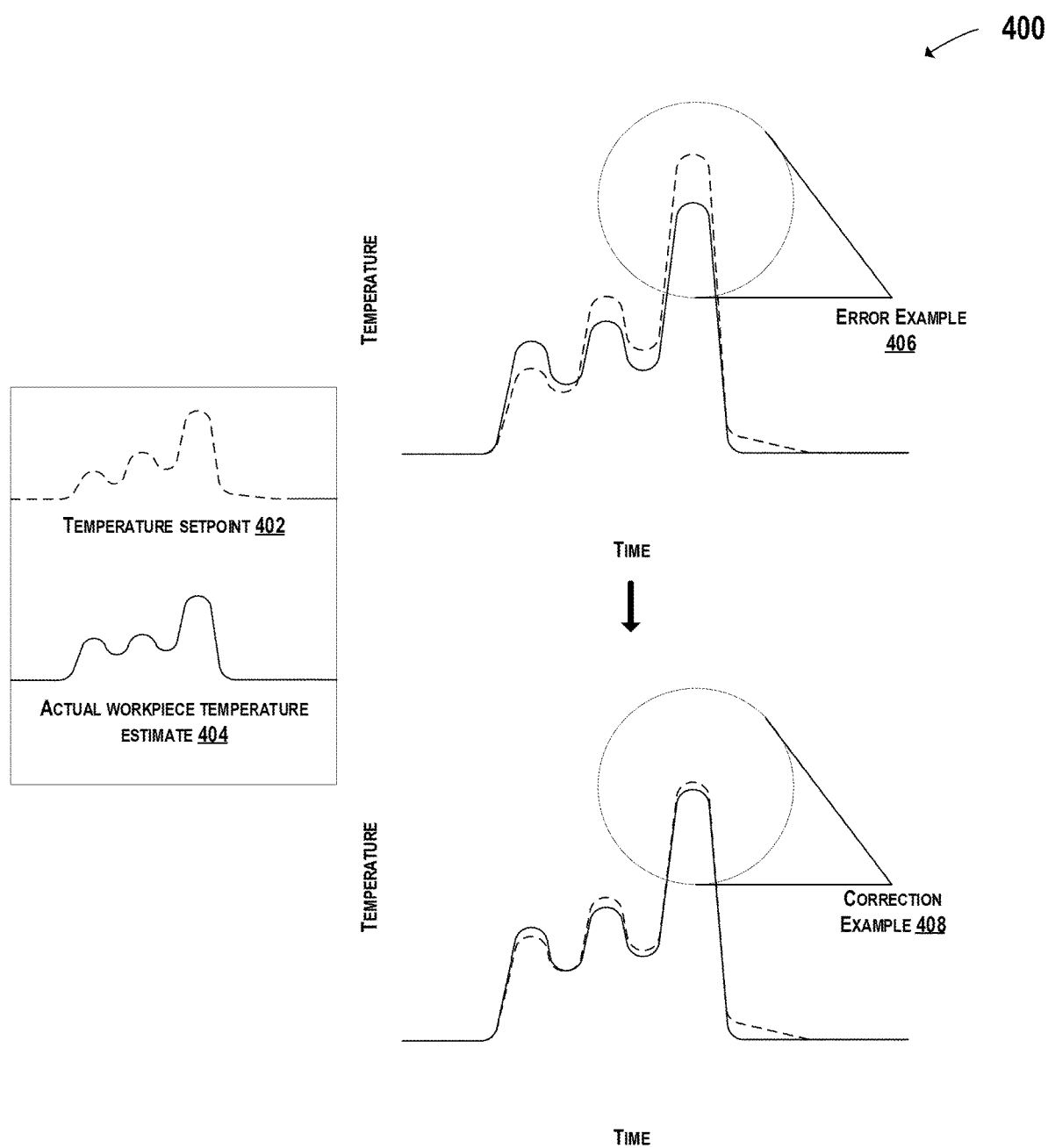
FIG. 4 shows a schematic representation of a control routine operable to train a workpiece/chamber optical submodel of a system model to emulate thermal processing system optical outputs according to example embodiments of the present disclosure.

FIG. 4 depicts an example schematic representation of a control routine 400 operable to train a workpiece/chamber optical submodel of a system model to emulate thermal processing system optical outputs according to example embodiments of the present disclosure.

Actual radiometer signals 402 can be determined based at least in part by a temperature set point 602, as depicted in FIG. 4. The actual radiometer signals 402, along with the known test workpiece temperature and optical properties 418, are sent as inputs to the model parameter tuner 412. The actual radiometer signals 402 are also sent as an input to the workpiece/chamber optical model 404.

The workpiece/chamber optical model 404 can emulate the conditions and output of the optical properties of a thermal processing system based at least in part on the actual radiometer signals 402. The workpiece/chamber optical model 404 includes a plurality of model parameters. The model parameters can be adjusted by the model parameter tuner 412 using model parameter adjustments 416. The workpiece/chamber optical model 404 can produce predicted workpiece optical properties 420. The predicted workpiece optical properties 420 are operable to predict known workpiece optical properties 420 associated with a test workpiece of the thermal processing system.

The model parameter tuner 412 can be trained to dynamically adjust the parameters of the workpiece/chamber optical model 404 using model parameter adjustments 416. The model parameter tuner 412 can be a machine learned model. For example, the model parameter tuner 412 can be a random forest classifier; a logistic regression classifier; a support vector machine; one or more decision trees; a neural network; and/or other types of models including both linear models and non-linear models. Neural networks can include deep neural networks, feed-forward neural networks, recurrent neural networks (e.g., long short-term memory recurrent neural networks), convolutional neural networks, or combinations thereof. For example, the model parameter tuner 412 may be an artificial neural network trained to dynamically adjust the parameters of the workpiece/chamber optical model 404 using model parameter adjustments 416.

The model parameter tuner 412 can be trained using a tuning learning routine 410. The tuning learning routine 410 can be a differentiable objective function operable to, when optimized, provide tuning parameter adjustments 414 for the model parameter tuner 412 that reduce the difference between the predicted workpiece optical properties 420 and the known workpiece optical properties 408. The tuning learning routine 410 can receive one or more inputs, including but not limited to a difference between the predicted workpiece optical properties 420 and the known workpiece optical properties 408.

The control routine 400 can apply the model parameter adjustments 416 to the workpiece/chamber optical model 404 using an optimization method. An optimization method can be, but is not limited to, one or more of backpropagation, stochastic gradient descent, mini-batch gradient descent, or any other first or second order optimization method that can be applied to a machine learned model. For example, one or more adjustments can be applied to the workpiece/chamber optical model 404 by utilizing a stochastic gradient descent method. For another example, the one or more adjustments can be determined and applied using a backpropagation method in conjunction with a mini-batch gradient descent method. For yet another example, the one or more adjustments can be determined and applied using a backpropagation method in conjunction with a different first order optimization method.

Figure 5:
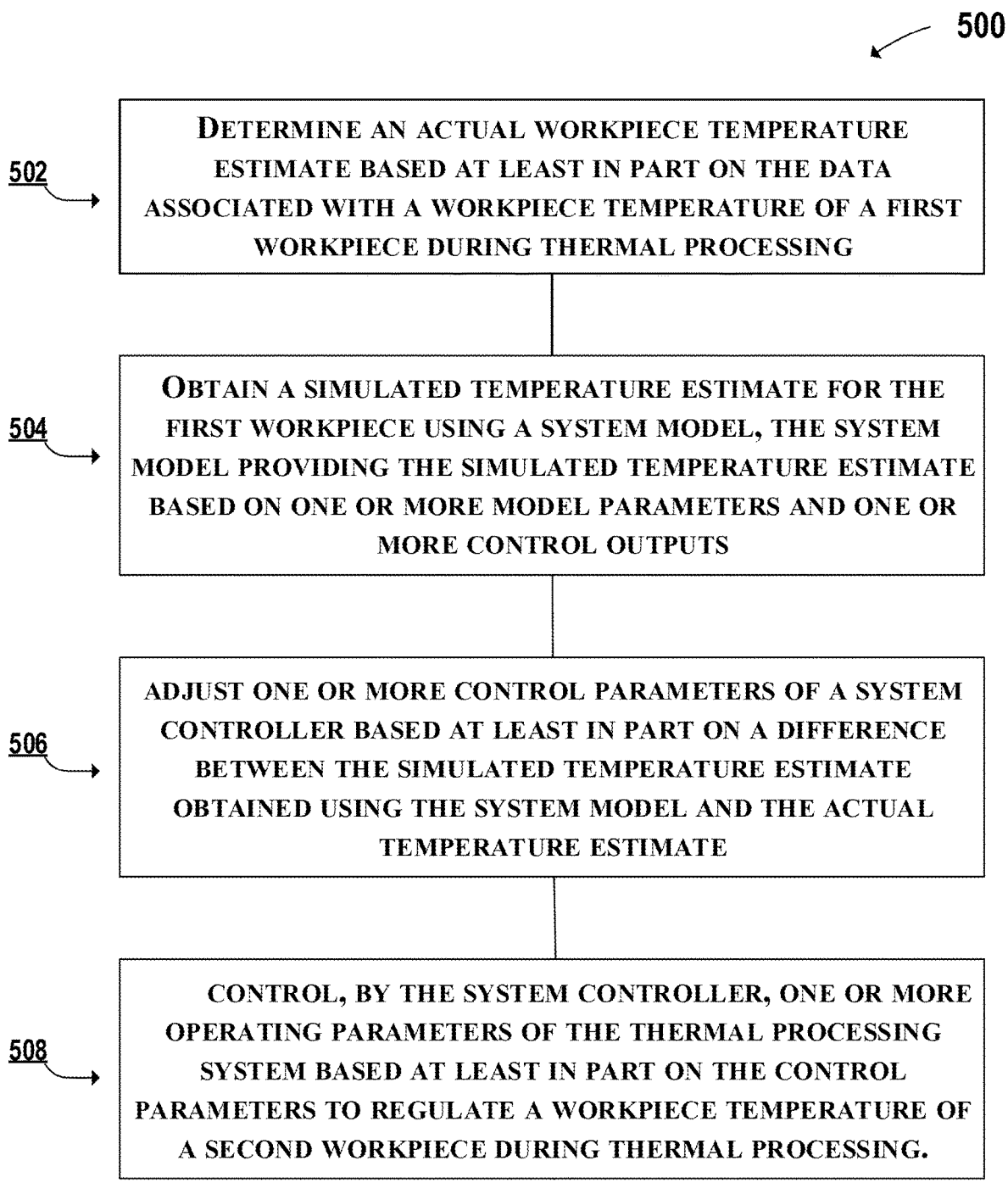
FIG. 5 shows a schematic representation of a control routine operable to train a workpiece/chamber thermal submodel of a system model to emulate thermal processing system thermal outputs according to example embodiments of the present disclosure.

FIG. 5 depicts an example schematic representation of a control routine 500 operable to train a workpiece/chamber thermal submodel of a system model to emulate thermal processing system thermal outputs according to example embodiments of the present disclosure.

Lamp power levels 502 can be determined based at least in part by a temperature set point 602, as depicted in FIG. 5. The lamp power levels 502, along with the known test workpiece temperature and optical properties 518, are sent as inputs to the model parameter tuner 512. The lamp power levels 502 are also sent as an input to the workpiece/chamber thermal model 504.

The workpiece/chamber thermal model 504 can emulate the conditions and output of the thermal properties of a thermal processing system based at least in part on the lamp power levels 502. The workpiece/chamber thermal model 504 includes a plurality of model parameters. The model parameters can be adjusted by the model parameter tuner 512 using model parameter adjustments 516. The workpiece/chamber thermal model 504 can produce estimated workpiece temperature 520. The estimated workpiece temperature 520 is operable to predict a known workpiece temperature 520 associated with a test workpiece of the thermal processing system.

The model parameter tuner 512 can be trained to dynamically adjust the parameters of the workpiece/chamber thermal model 504 using model parameter adjustments 516. The model parameter tuner 512 can be a machine learned model. For example, the model parameter tuner 512 can be a random forest classifier; a logistic regression classifier; a support vector machine; one or more decision trees; a neural network; and/or other types of models including both linear models and non-linear models. Neural networks can include deep neural networks, feed-forward neural networks, recurrent neural networks (e.g., long short-term memory recurrent neural networks), convolutional neural networks, or combinations thereof. For example, the model parameter tuner 512 may be an artificial neural network trained to dynamically adjust the parameters of the workpiece/chamber thermal model 504 using model parameter adjustments 516.

The model parameter tuner 512 can be trained using a tuning learning routine 510. The tuning learning routine 510 can be a differentiable objective function operable to, when optimized, provide tuning parameter adjustments 514 for the model parameter tuner 512 that reduce the difference between the estimated workpiece temperature 520 and the known workpiece temperature 508. The tuning learning routine 510 can receive one or more inputs, including but not limited to a difference between the difference between the estimated workpiece temperature 520 and the known workpiece temperature 508.

The control routine 500 can apply the model parameter adjustments 516 to the workpiece/chamber thermal model 504 using an optimization method. An optimization method can be, but is not limited to, one or more of backpropagation, stochastic gradient descent, mini-batch gradient descent, or any other first or second order optimization method that can be applied to a machine learned model. For example, one or more adjustments can be applied to the workpiece/chamber thermal model 504 by utilizing a stochastic gradient descent method. For another example, the one or more adjustments can be determined and applied using a backpropagation method in conjunction with a mini-batch gradient descent method. For yet another example, the one or more adjustments can be determined and applied using a backpropagation method in conjunction with a different first order optimization method.

Figure 6:
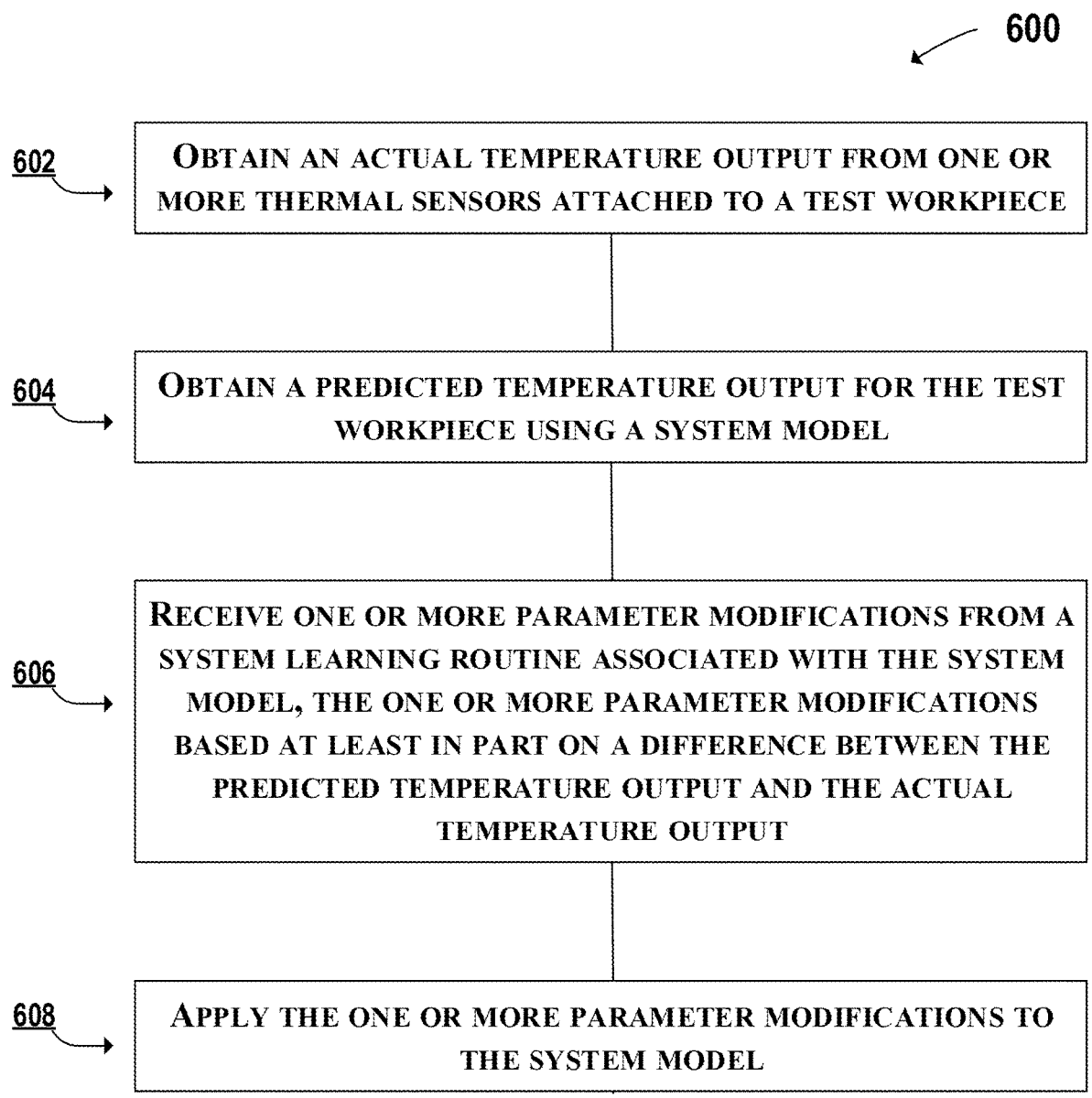
FIG. 6 shows a schematic representation of a control routine operable to implement a control tuner to generate temperature setpoint tracking improvements for a thermal processing system during the processing of workpieces according to example embodiments of the present disclosure.

FIG. 6 depicts an example schematic representation of a control routine 600 operable to implement a control tuner to generate temperature setpoint tracking improvements for a thermal processing system during the processing of workpieces according to example aspects of the present disclosure. The control routine 600 can determine improvements to controller performance based on actual processing of workpiece to improve temperature tracking with a temperature setpoint profile.

A temperature setpoint 602 can be a precise temperature value associated with a certain time during thermal processing of a workpiece as defined, for instance, by a temperature setpoint profile. The temperature setpoint 602 can be provided by a recipe type 634. In some embodiments, the recipe type 634 can be determined and/or selected by a user or technician. The temperature setpoint 602 can also be recorded in the setpoint recorder 628. A system controller 604 can control one or more operating parameters (e.g., heat source output, duration and/or intensity of heat, other adjustments to components of the thermal processing system, etc.) of thermal processing system 606 using system controller outputs 640. The system controller outputs 640 can be based at least in part on the temperature setpoint 602. The thermal processing system 606 can process the workpiece. Data from one or more sensors in the thermal processing system 606 can be processed to determine an actual workpiece temperature estimate associated with a workpiece of the thermal processing system 606. The actual workpiece temperature estimate 608 can be based at least in part on the system controller outputs 640.

For example, a temperature setpoint 602 may specify a temperature of 500 degrees Celsius. The system controller 604 can control the operating parameters of thermal processing system 606 using system controller outputs 640 to heat the workpiece in the thermal processing system 606 to 500 degrees Celsius. Data from sensors (e.g., a pyrometer) in the thermal processing system 606 can be processed to determine an actual workpiece temperature estimate 608 associated with an estimated temperature of the workpiece in the thermal processing system 606.

A clone system controller 626 can output one or more operating parameters to a system model 616 using clone system controller outputs 618. The clone system controller outputs 618 can be based at least in part on the temperature setpoint 602. The clone system controller 626 can be a simulation of the system controller 604. For instance, the clone system controller 626 can be operable to perform clone system controller outputs 618 that initially are substantially similar to system controller outputs 640.

According to example embodiments of the present disclosure, the system model 616 can be a machine-learned model that is trained to simulate the thermal processing system 606. The system model 616 can receive clone system controller outputs from the clone system controller 626 in the same manner that the thermal processing system 606 receives system controller outputs 640 from the system controller 604. The system model 616 can be operable to model the conditions and output of the thermal processing system 606. More specifically, the system model 616 can be trained to provide a simulated workpiece temperature estimate 610 associated with a first workpiece of thermal processing system 606, the simulated workpiece temperature estimate 616 simulating an actual workpiece temperature estimate 608 associated with the first workpiece of thermal processing system 606.

Furthermore, the system model 616 can be trained to provide predicted workpiece properties associated with a workpiece, including but not limited to simulated temperature and optical properties simulating actual temperature and optical properties associated with a workpiece.

In some embodiments, the system model 616 can be a machine learned model. For example, the system model can be a random forest classifier; a logistic regression classifier; a support vector machine; one or more decision trees; a neural network; and/or other types of models including both linear models and non-linear models. Neural networks can include deep neural networks, feed-forward neural networks, recurrent neural networks (e.g., long short-term memory recurrent neural networks), convolutional neural networks, or combinations thereof. For example, the system model 616 may be trained to provide a simulated workpiece temperature estimate by using an artificial neural network.

The simulated workpiece temperature estimate 610, along with the actual workpiece temperature estimate 608, can initially be provided to the system model watchdog 612. The system model watchdog 612 can determine, based at least in part on a difference between the actual workpiece temperature estimate 608 and the simulated workpiece temperature estimate 610, whether the system model 616 is sufficiently accurate. If the system model watchdog 612 determines that the system model 616 is not sufficiently accurate, the system model 616 can undergo a retraining phase substantially similar to the process previously depicted in FIG. 2.

If the system model watchdog 612 determines that the system model 616 is sufficiently accurate, the system model 616 can provide the simulated workpiece temperature estimate 610 to the tuning learning algorithm 620 and the clone control tuner 622.

The clone control tuner 622 can be operable to generate one or more clone controller parameter adjustments 630 for the clone system controller 626. More specifically, the clone control tuner 622 can be trained to provide one or more clone controller parameter adjustments 630 based at least in part on a difference between the simulated workpiece temperature estimate 610 and the temperature setpoint 602. The clone control tuner 622 can be a machine learned model. For example, the clone control tuner 622 can be a random forest classifier; a logistic regression classifier; a support vector machine; one or more decision trees; a neural network; and/or other types of models including both linear models and non-linear models. Neural networks can include deep neural networks, feed-forward neural networks, recurrent neural networks (e.g., long short-term memory recurrent neural networks), convolutional neural networks, or combinations thereof. For example, the clone control tuner 622 may be trained to provide one or more clone controller parameter adjustments by using an artificial neural network.

The clone control tuner 622 can be trained using a tuning learning routine 620. A tuning learning routine 620 can be a differentiable objective function operable to, when optimized, provide control tuner adjustments 636 for the clone control tuner 622 that can reduce a difference between the simulated workpiece temperature estimate 610 and the temperature setpoint 602. Alternatively, or in combination, the clone control tuner 622 can provide clone controller parameter adjustments 630 based at least in part on a difference between predicted workpiece properties 632 and known workpiece properties associated with the recipe type 634 stored in recipe type recorder 624. The tuning learning routine 620 can receive one or more inputs, including but not limited to a difference between the simulated workpiece temperature estimate 610 and the temperature setpoint 602.

The control system 600 can adjust the parameters of the clone control tuner 622 using an optimization method. An optimization method can be, but is not limited to, one or more of backpropagation, stochastic gradient descent, mini-batch gradient descent, or any other first or second order optimization method that can be applied to a machine learned model. For example, one or more control tuner adjustments 636 can be applied to the clone control tuner 622 by utilizing a stochastic gradient descent method. For another example, the one or more adjustments can be determined and applied using a backpropagation method in conjunction with a mini-batch gradient descent method. For yet another example, the one or more adjustments can be determined and applied using a backpropagation method in conjunction with a different first order optimization method.

The clone controller parameter adjustments 636 generated by the clone control tuner 622 can be recorded in a recipe type recorder 634. The recipe type recorder 644 can track the performance of the simulated workpiece temperature estimate 610 resulting from the clone controller parameter adjustments 630. If the clone system controller 626 uses clone system controller outputs 618 to control the system model 616 to produce a simulated workpiece temperature estimate 610 that is more accurate than a simulated workpiece temperature estimate 610 previously stored in the recipe type recorder, the clone control tuner 622 can provide the same clone controller parameter adjustments 622 to a trusted control tuner 614.

The trusted control tuner 614 can be operable to apply system controller parameter adjustments 638 to the system controller 604. If the trusted control tuner 614 receives clone controller parameter adjustments 630 from the clone control tuner 622, the trusted control tuner 614 can generate system controller parameter adjustments 638 that are substantially similar to the clone controller parameter adjustments 630. The trusted control tuner 614 can apply the system controller parameter adjustments 638 to the system controller 604, which can control the thermal processing system 606 based at least in part on the system controller parameter adjustments 638.

For example, the clone control tuner 622 can produce one or more clone controller parameter adjustments 630 that are determined to decrease the difference between the simulated workpiece temperature estimate 610 and the temperature setpoint 602. The clone control tuner 622 can then provide these one or more clone controller parameter adjustments 630 to the trusted control tuner 614. The trusted control tuner 614 can generate one or more system controller parameter adjustments 638 that are substantially similar the one or more clone controller parameter adjustments 630. The trusted control tuner 614 can apply the system controller parameter adjustments to the system controller 604, adjusting the way that system controller 604 controls the thermal processing system 606 using system controller outputs 640.

The control system 600 can evaluate whether the actual workpiece temperature estimate 608 is more accurate due to the one or more system controller parameter modifications 638. If the actual workpiece temperature estimate 608 is determined to be more accurate, the trusted control tuner 614 will retain the one or more system controller parameter modifications 638. If the actual workpiece temperature estimate 608 is determined to be less accurate, the trusted control tuner 614 will discard the one or more system controller parameter modifications 638 and alert the system model watchdog 612. The system model watchdog 612 can determine, based on the decreased performance, that the system model 616 should be retrained. The system model 616 can be retrained in a manner substantially similar to the process depicted in FIG. 2.

Figure 7:
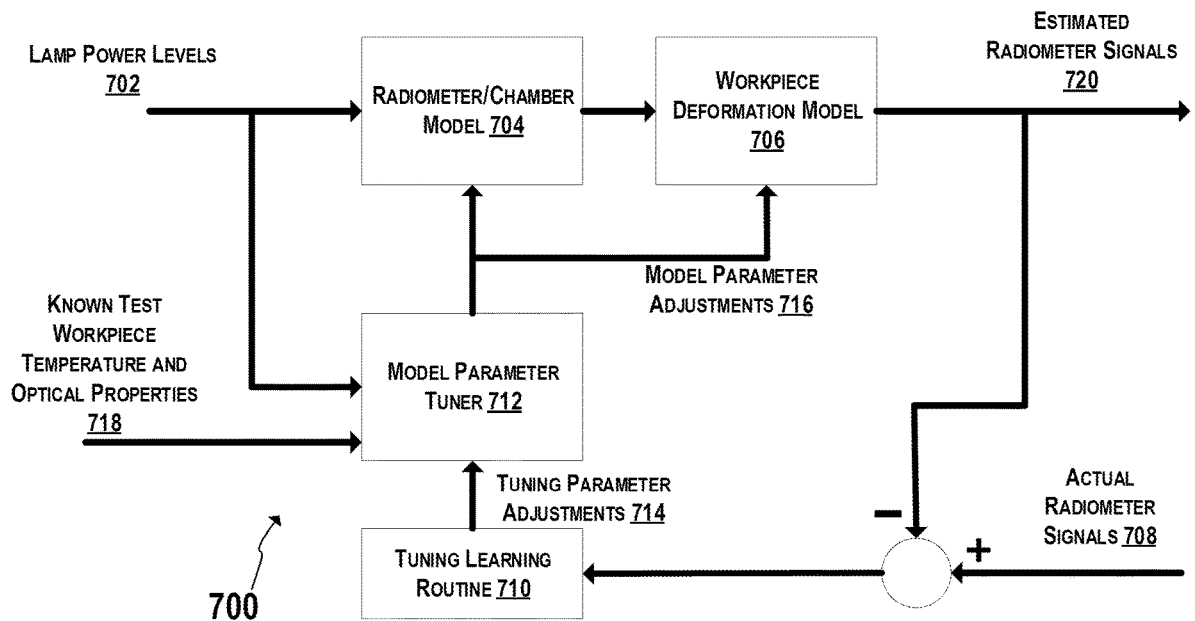
FIG. 7 depicts an example representation of results from applying one or more temperature setpoint tracking improvements to a thermal processing system according to example embodiments of the present disclosure.

FIG. 7 depicts an example representation 700 of results from applying one or more temperature setpoint tracking improvements to a thermal processing system according to example embodiments of the present disclosure. As illustrated, the representation 700 includes a temperature setpoint 702, an actual workpiece temperature estimate 704, an error example 706, and a correction example 708.

The representation 700 includes an error example 706 demonstrating a calculated difference between a temperature setpoint 702 and an actual workpiece temperature estimate 704 that exists before the system controller 604 has been adjusted by the trusted control tuner 614 of FIG. 6. The temperature setpoint 702 can be obtained from a recipe, and can call for specific temperatures in the thermal processing system to be applied at specific times. The actual workpiece temperature estimate 704 can be measured intermittently over time with the objective of tracking the temperature setpoint 702 as closely as possible. The accuracy of the actual workpiece temperature estimate 702 is based at least in part on the system controller outputs 640 of system controller 604, as depicted in FIG. 6.

The correction example 708 demonstrates a calculated reduction in the difference previously depicted in error example 706 between the temperature setpoint 702 and the actual workpiece temperature estimate 704. This reduction can be attributed, at least in part, to one or more system controller parameter adjustments 638 applied to the system controller 604 by trusted control tuner 614, as depicted in FIG. 6. This correction process, as demonstrated by correction example 708, is iterative, and can operate continuously during thermal processing to constantly improve the tracking of the actual workplace temperature estimate 704 to the temperate setpoint 602.

Figure 8:
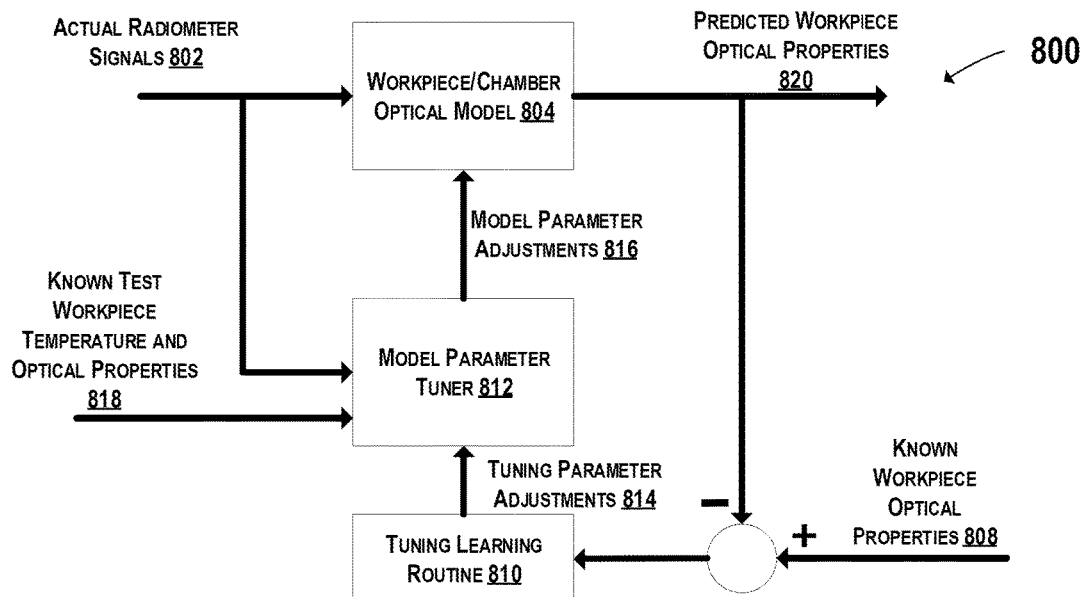
FIG. 8 depicts a flow diagram of a process for adaptively controlling a thermal processing system according to example embodiments of the present disclosure.

FIG. 8 depicts a flow diagram of a process (800) for adaptively controlling a thermal processing system according to example embodiments of the present disclosure. The process (800) can be implemented using the control system 600. FIG. 8 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (802), the process can include determining an actual workpiece temperature estimate based at least in part on the data associated with a workpiece temperature of a first workpiece during thermal processing of the workpiece. For example, in the embodiment of FIG. 6, the actual workpiece temperature estimate 608 can be determined based at least in part on system controller outputs 640 to the thermal processing system 606, the actual workpiece temperature estimate 608 associated with a workpiece temperature of a first workpiece of the thermal processing system 606.

At (804), the process can include obtaining a simulated temperature estimate for the first workpiece using a system model, the system model providing the simulated temperature estimate based on one or more model parameters and one or more controller outputs. For example, in the embodiment of FIG. 6, the simulated workpiece temperature estimate 610 can be determined based at least in part on clone system controller outputs 618 to the system model 616, the simulated workpiece temperature estimate 610 associated with a workpiece temperature of a first workpiece of the thermal processing system 606.

At (806), the process can include adjusting one or more controller parameters of a system controller based at least in part on a difference between the simulated temperature estimate obtained using the system model and the actual temperature estimate. For example, in the embodiment of FIG. 6, the trusted control tuner 614 can generate and implement system controller parameter adjustments 638 that are substantially similar to clone controller parameter adjustments 630. The clone controller parameter adjustments 630 are generated at least in part on differences between the simulated workpiece temperature estimate 610 and the temperature setpoint 602.

At (808), the process can include controlling, by the system controller, one or more operating parameters of the thermal processing system based at least in part on the controller parameters to regulate a workpiece temperature of a second workpiece during thermal processing. For example, in the embodiment of FIG. 6, the system controller 604 controls the operating parameters of thermal processing 606 using system controller outputs 640. The system controller outputs 640 can be applied to the thermal processing system 606 for processing of a subsequent second workpiece of the thermal processing system 606.

Figure 9:
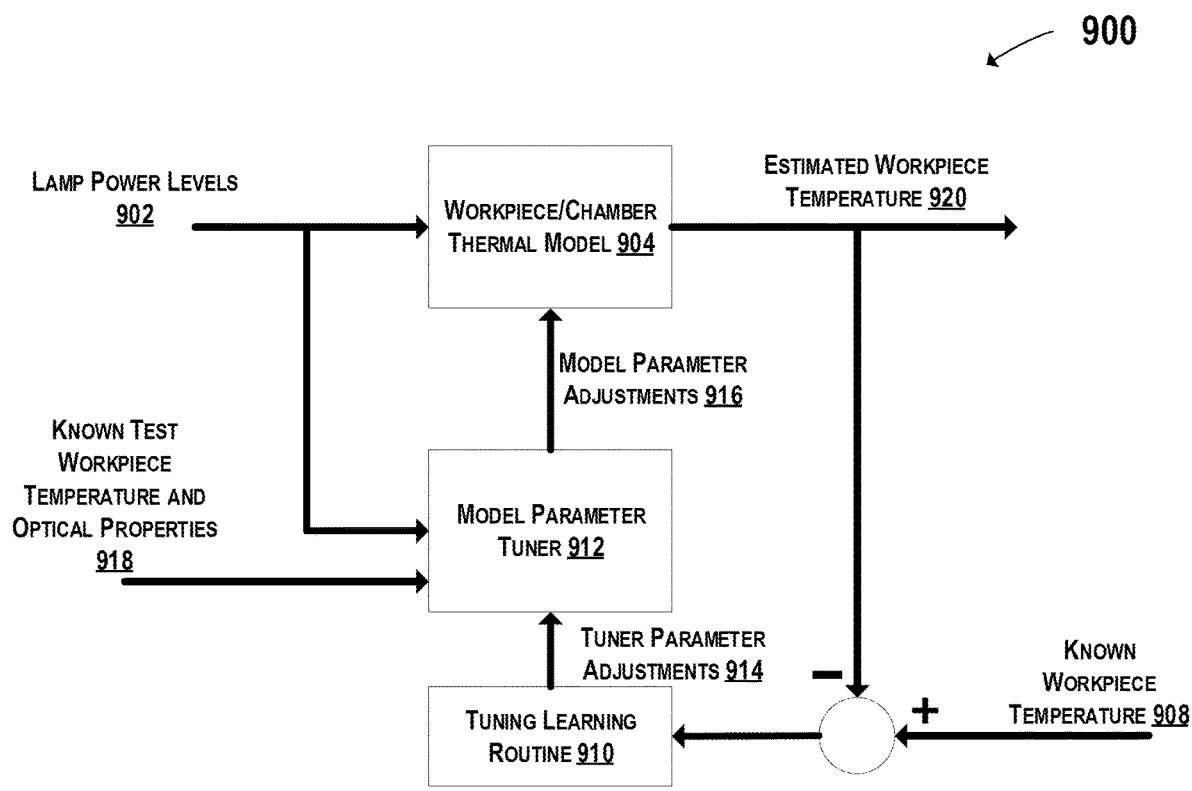
FIG. 9 depicts a flow diagram of a process for adaptively controlling a thermal processing system according to example embodiments of the present disclosure.

FIG. 9 depicts a flow diagram of a process (900) for adaptively controlling a thermal processing system according to example embodiments of the present disclosure. The process (900) can be implemented using the control system 200. FIG. 9 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (902), the process can include obtaining an actual temperature output from one or more thermal sensors attached to a test workpiece. For example, in the embodiment of FIG. 2, a thermal processing system can include a test workpiece. The test workpiece can include one or more temperature sensors (e.g., one or more thermocouples) to measure the heat of the test workpiece. The thermocouples can measure the heat at a precision sufficient to provide an actual temperature output 218.

At (904), the process can include obtaining a simulated temperature estimate for the test workpiece using the system model. For example, in the embodiment of FIG. 2, a system model 206 can produce a simulated temperature estimate 216 associated with the test workpiece of a thermal processing system 204.

At (906), the process can include receiving one or more parameter modifications from a system learning routine associated with the system model, the one or more parameter modifications based at least in part on a difference between the simulated temperature estimate and the actual temperature output. For example, in the embodiment of FIG. 2, a system learning routine 210 can receive as an input a difference between a simulated temperature estimate 216 and an actual system output 218. The system learning routine 210 can generate one or more parameter modifications 214 based at least in part on the difference between the simulated temperature estimate 216 and the actual system output 218.

At (908), the process can include applying the one or more parameter modifications to the system model. For example, in the embodiment of FIG. 2, the control system 200 can apply the parameter modifications 214 received from the system learning routine 210 to the system model 206, modifying the parameters of system model 206.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for training a system model associated with a thermal processing system for processing a workpiece, the method comprising:
- obtaining, by a control system of a thermal processing system, an actual temperature output from one or more thermal sensors attached to a test workpiece, and further obtaining actual workpiece properties of the test workpiece;
- obtaining, by the control system, a simulated temperature estimate for the test workpiece using the system model, and further obtaining simulated workpiece properties associated with the test workpiece using the system model;
- receiving, by the control system, one or more parameter modifications from a system learning routine associated with the system model, the one or more parameter modifications based at least in part on a difference between the simulated temperature estimate and the actual temperature output and a difference between the simulated workpiece properties and the actual workpiece properties, and
- applying, by the control system, the one or more parameter modifications to the system model.

2. The method of claim 1, wherein the system model comprises a machine-learned neural network.

3. The method of claim 1, wherein the system model comprises one or more parameters associated with associated with emulating an output of a radio meter of the thermal processing system.

4. The method of claim 1, wherein the system model comprises one or more parameters associated with workpiece deformation.

5. The method of claim 1, wherein the system model comprises one or more parameters associated with optical properties of a workpiece.

6. The method of claim 1, wherein the one or more thermal sensors each comprise a thermocouple.

* * * * *